United States Patent
Kim

[19]

[11] Patent Number: 5,864,377
[45] Date of Patent: Jan. 26, 1999

[54] LIQUID CRYSTAL DISPLAY

[75] Inventor: Heui-jong Kim, Kyundki-do, Rep. of Korea

[73] Assignee: Samsung Electronics Co., Ltd., Suwon, Rep. of Korea

[21] Appl. No.: 746,884

[22] Filed: Nov. 18, 1996

[51] Int. Cl.⁶ .................................................. G02F 1/1345
[52] U.S. Cl. .......................................... 349/150; 349/152
[58] Field of Search ..................................... 349/149, 150, 349/152; 361/789, 751, 771, 773, 774, 803

[56] References Cited

U.S. PATENT DOCUMENTS

| | | | |
|---|---|---|---|
| 5,089,750 | 2/1992 | Hatada et al. | 315/169.3 |
| 5,193,022 | 3/1993 | Hirai | 349/150 |
| 5,270,848 | 12/1993 | Takabayashi et al. | 359/88 |
| 5,317,438 | 5/1994 | Suzuki et al. | 349/149 |
| 5,393,359 | 2/1995 | Chang et al. | 349/150 |
| 5,404,239 | 4/1995 | Hirai | 349/150 |
| 5,528,403 | 6/1996 | Kawaguchi et al. | 349/149 |
| 5,572,346 | 11/1996 | Sakamoto et al. | 349/150 |
| 5,576,869 | 11/1996 | Yoshida | 349/149 |
| 5,606,440 | 2/1997 | Kawaguchi et al. | 349/188 |
| 5,657,104 | 8/1997 | Kanezawa | 349/149 |

FOREIGN PATENT DOCUMENTS

| | | | |
|---|---|---|---|
| 4-88320 | 3/1992 | Japan | 349/149 |

*Primary Examiner*—William L. Sikes
*Assistant Examiner*—Tiep H. Nguyen
*Attorney, Agent, or Firm*—Jones & Volentine, L.L.P.

[57] ABSTRACT

A liquid crystal display (LCD) is provided. The LCD includes a solder-coated pad on a printed circuit board (PCB) and a solder-coated lead of a tape automated bonding integrated circuit (TAB IC). The solder-coated lead has a different shape from the solder-coated pad is electrically connected with the solder-coated pad. The difference of shape between the solder-coated lead and the solder-coated pad improves the quality of soldering between the solder-coated lead of the TAB IC and the solder-coated pad on the PCB and thus improves the yield of the LCD production method.

18 Claims, 6 Drawing Sheets

LIQUID CRYSTAL DISPLAY

BACKGROUND OF THE INVENTION

The present invention relates to a liquid crystal display device (LCD). More particularly the present invention relates to a LCD driven by electrically connecting a tape automated bonding integrated circuit (TAB IC) with a printed circuit board (PCB).

In conventional integrated circuits, electric wires are generally connected by soldering, a method involving connecting solid metals using a medium such as a solder through a thermal process. A soldering method joins solid metal pieces together using a solder that has a lower melting point than those of solid metals to be connected. The solder is melted and diffused during the melting process by a capillary action to connect two or more solid metal pieces into a single assembly.

A conventional LCD module manufacturing process includes a TAB-solder step for thermally compressing a solder-coated pad on a TAB IC after an out leader bonding (OLB) process. In the TAB-solder step, the solder-coated pad on the PCB and a solder-coated lead of a TAB IC are connected by thermal compression. During thermal compression, a solder cream is melted from the solder-coated pad on the PCB to cover the solder-coated lead of the TAB IC, thus connecting the solder-coated pad on the PCB to the solder-coated lead of the TAB IC. Because of the importance of this connection, the solder-coated pad on the PCB should be carefully matched to the solder-coated lead of the TAB IC during the thermal compression step. In addition, it is important to have a structure that can help the diffusion of the solder cream in this method.

FIG. 1 is a diagram showing a connection state among a liquid crystal panel, the TAB IC and the PCB in a conventional LCD, and FIG. 2 is a side view of the device in FIG. 1.

As shown in FIGS. 1 and 2, the TAB IC 13 electrically together with peripheral circuits (not shown) on a PCB 15 drives a liquid crystal panel 11. The TAB IC 13 serves to electrically connect the PCB 15 and the liquid crystal panel 11.

FIG. 3 is a perspective view of a solder-coated pad 33 on a PCB and a solder-coated lead 31 of a TAB IC 13 in a conventional LCD. The solder-coated lead 31 of the TAB IC and solder-coated pad 33 on the PCB shown in FIG. 3 are both comprised of lead and both have a rectangular shape. In this structure, a horizontal side length $L_1$ of the solder-coated lead 31 of the TAB IC is the same as a horizontal side length $L_2$ of the solder-coated pad 33 on the PCB.

FIG. 4 is a diagram showing a state where the solder-coated pad 33 on the PCB and the solder-coated lead 31 of the TAB IC, shown in FIG. 3, are soldered together. As shown in FIG. 4, during the process of thermally soldering them, the solder cream is diffused from the solder-coated pad on the PCB into the solder-coated lead of the TAB IC. When using the solder-coated pad 33 and the solder-coated lead 31 of FIG. 3, the diffusion of solder from the solder-coated pad 33 onto the solder-coated lead 31 occurs in a pattern similar to that shown by the shaded portion 41 in FIG. 4. Here, the solder cream is only partially diffused into the solder-coated lead of the TAB IC, resulting in a lower soldering quality of the contact between the solder-coated lead of the TAB IC and the solder-coated pad on the PCB. Because of this lower quality soldering, the two components are occasionally electrically isolated.

Much of the shape of the diffusion of solder results from the shape of the solder-coated lead 31 and the solder-coated pad 33 and the fact that the horizontal side length $L_1$ of the solder-coated lead 31 of the TAB IC is the same as the horizontal side length $L_2$ of the solder-coated pad 33 on the PCB. In order to increase the quality of soldering between the solder-coated lead 31 of the TAB IC and the solder-coated pad 33 on the PCB, it is desirable that their shapes should be different to widely diffuse the solder cream during the soldering process.

SUMMARY OF THE INVENTION

It is an object of the present invention to provide a liquid crystal display (LCD) in which quality of soldering between a solder-coated lead of a tab automated bonding integrated circuit (TAB IC) and a solder-coated pad on a printed board (PCB) is increased.

To achieve the above object, there is provided a liquid crystal display comprising a solder-coated pad on a printed circuit board and a solder-coated lead of a tape automated bonding integrated circuit, having a different shape from that of the solder-coated pad, the solder-coated lead being electrically connected with the solder-coated pad.

The solder-coated lead may have a rectangular surface and the solder-coated pad has a trapezoid surface whose first horizontal side length is about twice a horizontal side length of the solder-coated lead. The solder-coated pad may also have a rectangular surface and the solder-coated lead have a trapezoid surface whose first horizontal side length is about half of a horizontal side length of the solder-coated pad. The orientation of the trapezoidal surface may be in either direction.

The solder-coated lead may also have a rectangular surface and the solder-coated pad has a hexagonal surface whose inner horizontal side length is twice a horizontal side length of the solder-coated lead. The solder-coated pad may also have a rectangular surface and the solder-coated lead have a hexagonal surface whose upper horizontal side length is a half of a horizontal side length of the solder-coated pad.

The solder-coated lead may also have a rectangular surface and the solder-coated pad have a bow tie-like surface whose upper horizontal side length is twice a horizontal side length of the solder-coated lead. The solder-coated pad may also have a rectangular surface and the solder-coated lead have a bow tie-like surface whose central horizontal side length is a half of a horizontal side length of the solder-coated pad.

Accordingly, through the use of these differing pads and leads, the quality of soldering between the solder-coated lead of the TAB IC and the solder-coated pad on the PCB is increased.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
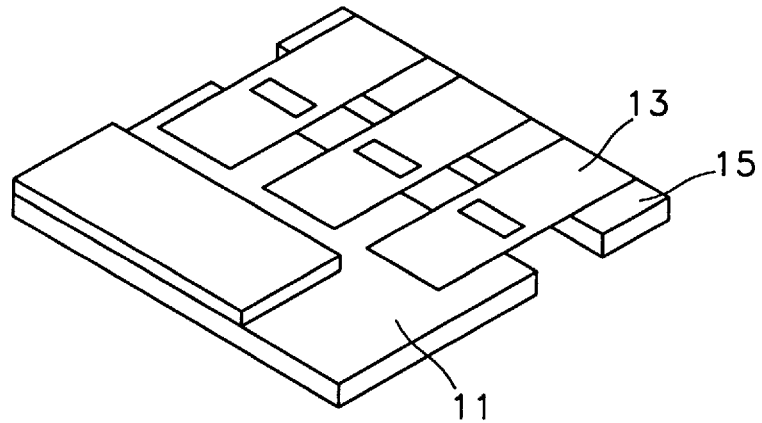
FIG. 1 is a diagram showing a connection state among a liquid crystal panel, a tab automated bonding integrated circuit (TAB IC) and a printed circuit board (PCB) in a general liquid crystal display (LCD)
Figure 2:
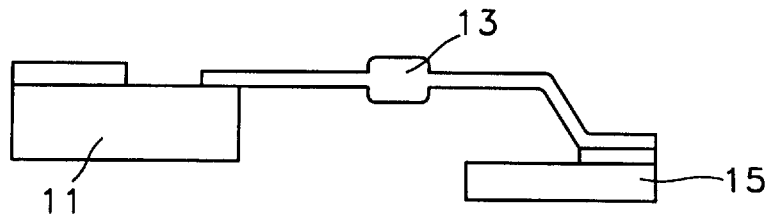
FIG. 2 is a side view of the device shown in FIG. 1.
Figure 3:
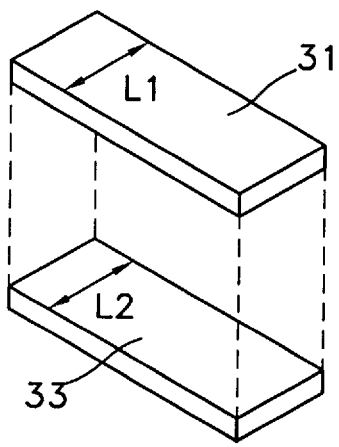
FIG. 3 is a perspective view of a solder-coated pad on a PCB and a solder-coated lead of a TAB IC from a conventional LCD.
Figure 4:
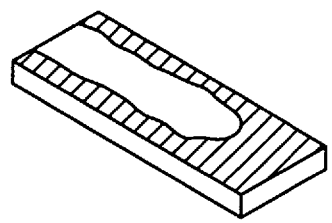
FIG. 4 is a diagram shown in the state where the solder-coated pad on the PCB and the solder-coated lead of the TAB IC shown in FIG. 3 are soldered.
Figure 5:
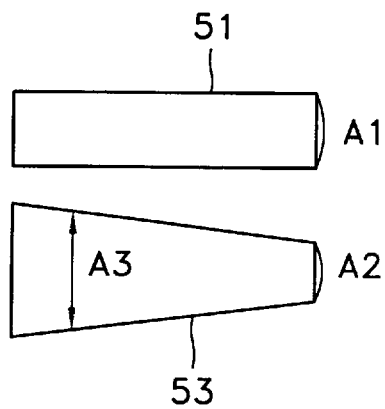
FIG. 5 is a perspective view of a solder-coated pad on a PCB and a solder-coated lead of a TAB IC of a LCD according to a first preferred embodiment of the present invention.
Figure 6:
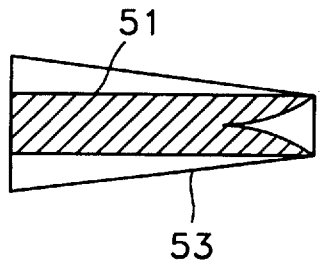
FIG. 6 is a diagram showing the state where the solder-coated pad on the PCB and the solder-coated lead of the TAB IC shown in FIG. 5 are soldered.

FIG. 5, shows a solder-coated pad 53 on a printed circuit board (PCB) and a solder-coated lead 51 of a tab automated bonding integrated circuit (TAB IC) in a liquid crystal display (LCD) according to the first embodiment of the present invention. The solder-coated lead 51 has a rectangular surface and the solder-coated pad 53 has a trapezoid surface. A horizontal side length $A_1$ of the solder-coated lead 51 is preferably the same as a first horizontal side length $A_2$ of the solder-coated pad 53. A second horizontal side length $A_3$ of the solder-coated pad 53 is preferably twice the horizontal side length $A_1$ of the solder-coated lead 51. This increases the diffusion of the solder cream of the solder-coated pad 53 into the solder-coated lead 51 during the heating process, as shown in FIG. 6. When using the solder-coated pad 53 and the solder-coated lead 51 of FIG. 5, the diffusion of solder from the solder-coated pad 53 onto the solder-coated lead 51 occurs in a pattern similar to that shown by the shaded portion 61 in FIG. 6. This increased diffusion of solder leads to an improvement in the quality of soldering between the solder-coated pad 53 and the solder-coated lead 51 as compared to conventional soldering methods.

Figure 7:
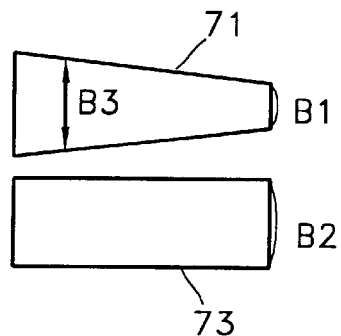
FIG. 7 is a perspective view of a solder-coated pad on a PCB and a solder-coated lead of a tape IC of a LCD according to a second preferred embodiment of the present invention.
Figure 8:
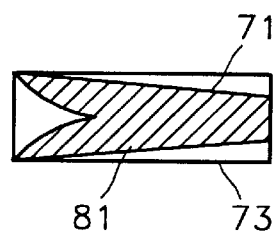
FIG. 8 is a diagram showing the state where the solder-coated pad on the PCB and the solder-coated lead of the TAB IC shown in FIG. 7 are soldered.

FIG. 7 shows a solder-coated pad 73 on a PCB and a solder-coated lead 71 of a TAB IC in a LCD according to a second preferred embodiment of the present invention. In this embodiment, the solder-coated lead 71 has a trapezoid surface and the solder-coated pad 73 has a rectangular surface. As shown in FIG. 8, a first horizontal side length $B_1$ of the solder-coated lead 71 is preferably half of a horizontal side length $B_2$ of the solder-coated pad 73. A second horizontal side length $B_3$ of the solder-coated lead 71 is preferably equal to the horizontal length $B_2$ of the solder-coated pad 73. This increases the diffusion of the solder cream of the solder-coated pad 73 into the solder-coated lead 71 during the heating process, as shown in FIG. 8. When using the solder-coated pad 73 and the solder-coated lead 71 of FIG. 7, the diffusion of solder from the solder-coated pad 73 onto the solder-coated lead 71 occurs in a pattern similar to that shown by the shaded portion 81 in FIG. 8. This increased diffusion of solder leads to an improvement in the quality of soldering between the solder-coated pad 73 and the solder-coated lead 71 as compared to conventional soldering methods.

Figure 9:
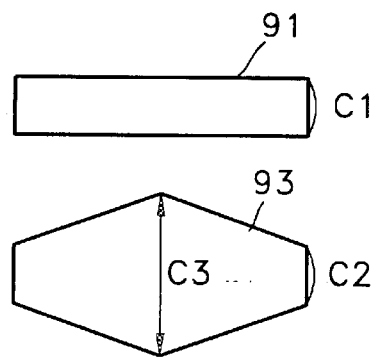
FIG. 9 is a perspective view of a solder-coated pad on a PCB and a solder-coated lead of a TAB IC of a LCD according to a third preferred embodiment of the present invention.
Figure 10:
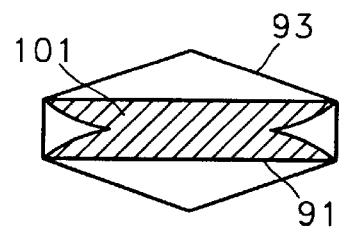
FIG. 10 is a diagram showing the state where the solder-coated pad on the PCB and the solder-coated lead of the TAB IC shown in FIG. 9 are soldered.

FIG. 9 shows a solder-coated pad 93 on a PCB and a solder-coated lead 91 of a TAB IC in a LCD according to a third preferred embodiment of the present invention. In this embodiment, the solder-coated lead 91 has a rectangular surface and the solder-coated pad 93 has a hexagonal surface. As shown in FIG. 9, a horizontal side length $C_1$ of the solder-coated lead 91 is preferably the same as an outer horizontal side length $C_2$ of the solder-coated pad 93. An inner horizontal side length $C_3$ of the solder-coated pad 93 is preferably twice the outer horizontal side length $C_2$ of the solder-coated pad 93. This increases the diffusion of the solder cream of the solder-coated pad 93 into the solder-coated lead 91 during the heating process, as shown in FIG. 10. When using the solder-coated pad 93 and the solder-coated lead 91 of FIG. 9, the diffusion of solder from the solder-coated pad 93 onto the solder-coated lead 91 occurs in a pattern similar to that shown by the shaded portion 101 in FIG. 10. This increased diffusion of solder leads to an improvement in the quality of soldering between the solder-coated pad 93 and the solder-coated lead 91 as compared to conventional soldering methods.

Figure 11:
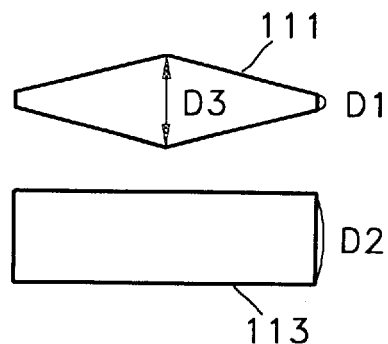
FIG. 11 is a perspective view of a solder-coated pad on a PCB and a solder-coated lead of a TAB IC of a LCD according to a fourth preferred embodiment of the present invention.
Figure 12:
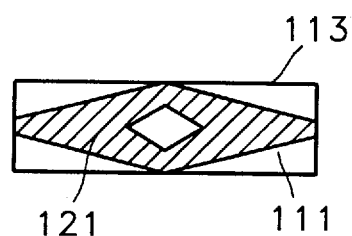
FIG. 12 is a diagram showing the state where the solder-coated pad on the PCB and the solder-coated lead of the TAB IC shown in FIG. 11 are soldered.

FIG. 11 shows a solder-coated pad 113 on a PCB and a solder-coated lead 111 of a TAB IC in a LCD according to a fourth preferred embodiment of the present invention. In this embodiment, the solder-coated lead 111 has a hexagonal surface and the solder-coated pad 113 has a rectangular surface. An outer horizontal side length $D_1$ of the solder-coated lead 111 is preferably half of a horizontal side length $D_2$ of the soldercoated pad 113. An inner horizontal side length $D_3$ of the solder-coated lead 111 is preferably the same as the horizontal side length $D_2$ of the solder-coated pad 113. This increases the diffusion of the solder cream of the solder-coated pad 113 into the solder-coated lead 111 during the heating process, as shown in FIG. 12. When using the solder-coated pad 113 and the solder-coated lead 111 of FIG. 11, the diffusion of solder from the solder-coated pad 113 onto the solder-coated lead 111 occurs in a pattern similar to that shown by the shaded portion 121 in FIG. 12. This increased diffusion of solder leads to an improvement in the quality of soldering between the solder-coated pad 113 and the solder-coated lead 111 as compared to conventional soldering methods.

Figure 13:
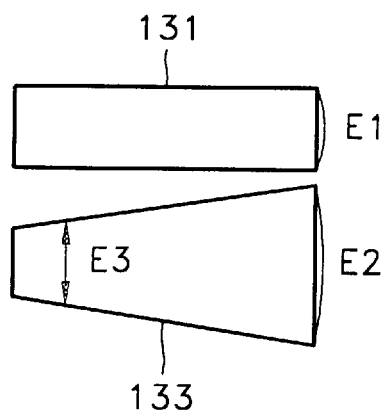
FIG. 13 is a perspective view of a solder-coated pad on a PCB and a solder-coated lead of a TAB IC of a LCD according to a fifth preferred embodiment of the present invention.
Figure 14:
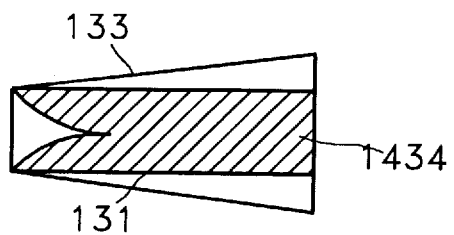
FIG. 14 is a diagram showing the state where the solder-coated pad on the PCB and the solder-coated lead of the TAB IC shown in FIG. 13 are soldered.

FIG. 13 shows a solder-coated pad 133 on a PCB and a solder-coated lead 131 of a TAB IC in a LCD according to a fifth preferred embodiment of the present invention. In this embodiment, the solder-coated lead 131 has a rectangular surface and the solder-coated pad 133 has a trapezoid surface opposite in orientation to the trapezoid shown in FIG. 5. A horizontal side length $E_1$ of the solder-coated lead 131 is preferably half of a first horizontal side length $E_2$ of the lead pad 133. A second horizontal side length $E_3$ of the lead pad 133 is preferably the same as the horizontal side length $E_1$ of the solder-coated lead 131. This increases the diffusion of the solder cream of the solder-coated pad 133 into the solder-coated lead 131 during the heating process, as shown in FIG. 14 in a manner similar to that shown in FIG. 6. When using the solder-coated pad 133 and the solder-coated lead 131 of FIG. 13, the diffusion of solder from the solder-coated pad 133 onto the solder-coated lead 131 occurs in a pattern similar to that shown by the shaded portion 141 in FIG. 14. This increased diffusion of solder leads to an improvement in the quality of soldering between the solder-coated pad 133 and the solder-coated lead 131 as compared to conventional soldering methods.

Figure 15:
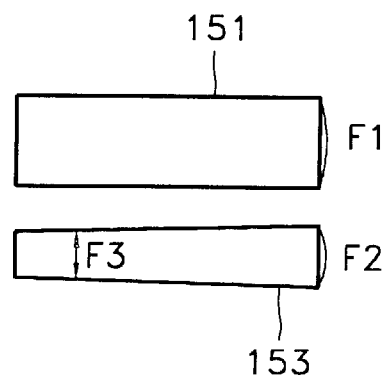
FIG. 15 is a perspective view of a solder-coated pad on a PCB and a solder-coated lead of a TAB IC of a LCD according to a sixth preferred embodiment of the present invention.
Figure 16:
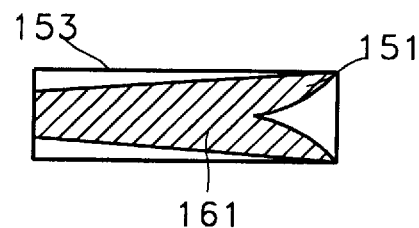
FIG. 16 is a diagram showing the state where the solder-coated pad on the PCB and the solder-coated lead of the TAB IC shown in FIG. 15 are soldered.

FIG. 15 shows a solder-coated pad 153 on a PCB and a solder-coated lead 151 of a TAB IC in a LCD according to a sixth preferred embodiment of the present invention. In this embodiment, the solder-coated pad 153 has a rectangular surface and the solder-coated lead 151 has a trapezoid surface opposite in orientation to the trapezoid shown in FIG. 7. A first horizontal side length $F_1$ of the solder-coated lead 151 is preferably the same as a horizontal side length $F_2$ of the solder-coated pad 153. A second horizontal length $F_3$ of the solder-coated lead 151 is preferably half of the upper horizontal side length $F_1$ of the solder-coated lead. This increases the diffusion of the solder cream of the solder-coated pad 153 into the solder-coated lead 151 during the heating process, as shown in FIG. 16 in a manner similar to that shown in FIG. 8. When using the solder-coated pad 153 and the solder-coated lead 151 of FIG. 15, the diffusion of solder from the solder-coated pad 153 onto the solder-coated lead 151 occurs in a pattern similar to that shown by the shaded portion 161 in FIG. 16. This increased diffusion of solder leads to an improvement in the quality of soldering between the solder-coated pad 153 and the solder-coated lead 151 as compared to conventional soldering methods.

Figure 17:
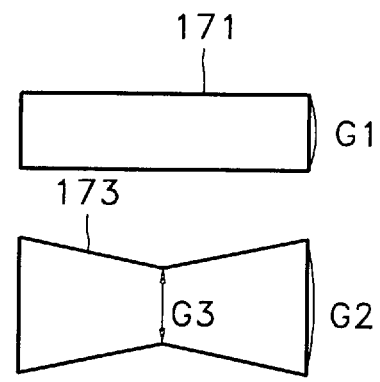
FIG. 17 is a perspective view of a solder-coated pad on a PCB and a solder-coated lead of a TAB IC of a LCD according to a seventh preferred embodiment of the present invention.
Figure 18:
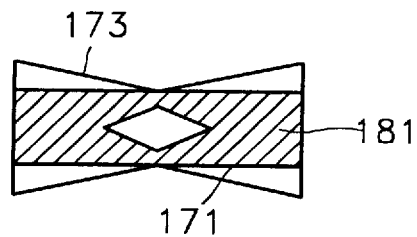
FIG. 18 is a diagram shown in the state where the solder-coated pad on the PCB and the solder-coated lead of the TAB IC shown in FIG. 17 are soldered.

FIG. 17 shows a solder-coated pad 173 on a PCB and a solder-coated lead 171 of a TAB IC in a LCD according to a seventh preferred embodiment of the present invention. In this embodiment, the solder-coated lead 171 has a rectangular surface and the solder-coated pad 173 has a bow tie-shaped surface. A horizontal side length $G_1$ of the solder-coated lead 171 is preferably half of an outer horizontal side length $G_2$ of the lead pad 173. The horizontal side length $G_1$ of the solder-coated lead 171 is preferably the same as a central horizontal side length $G_3$ of the lead pad 173. This increases the diffusion of the solder cream of the solder-coated pad 173 into the solder-coated lead 171 during the heating process, as shown in FIG. 18. When using the solder-coated pad 173 and the solder-coated lead 171 of FIG. 17, the diffusion of solder from the solder-coated pad 173 onto the solder-coated lead 171 occurs in a pattern similar to that shown by the shaded portion 181 in FIG. 18. This increased diffusion of solder leads to an improvement in the quality of soldering between the solder-coated pad 173 and the solder-coated lead 171 as compared to conventional soldering methods.

Figure 19:
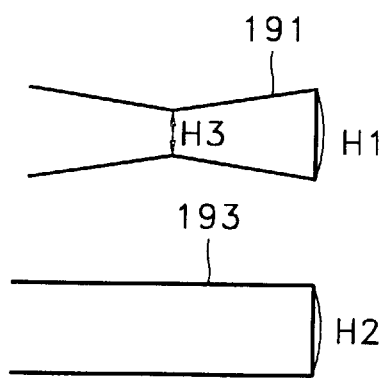
FIG. 19 is a perspective view of a solder-coated pad on a PCB and a solder-coated lead of a TAB IC of a LCD according to a eighth preferred embodiment of the present invention.
Figure 20:
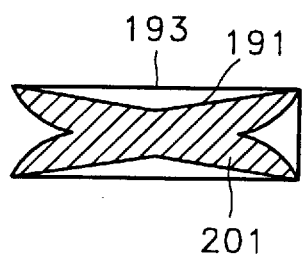
FIG. 20 is a diagram showing the state where the solder-coated pad on the PCB and the solder-coated lead of the TAB IC shown in FIG. 19 are soldered.

FIG. 19 shows a solder-coated pad 193 on a PCB and a solder-coated lead 191 of a TAB IC in a LCD according to an eighth embodiment of the present invention. In this embodiment, the solder-coated lead 191 has a bow tie-like surface and the solder-coated pad 193 has a rectangular surface. An outer horizontal side length $H_1$ of the solder-coated lead 191 is preferably the same as a horizontal side length $H_2$ of the solder-coated pad 193. An inner horizontal length $H_3$ of the solder-coated lead 191 is preferably half of the horizontal side length $H_2$ of the solder-coated pad 193. This increases the diffusion of the solder cream of the solder-coated pad 193 into the solder-coated lead 191 during the heating process, as shown in FIG. 20. When using the solder-coated pad 193 and the solder-coated lead 191 of FIG. 19, the diffusion of solder from the solder-coated pad 193 onto the solder-coated lead 191 occurs in a pattern similar to that shown by the shaded portion 201 in FIG. 20. This increased diffusion of solder leads to an improvement in the quality of soldering between the solder-coated pad 193 and the solder-coated lead 191 as compared to conventional soldering methods.

In each of the above preferred embodiments of the present invention, the solder-coated lead of the TAB IC is connected with the solder-coated pad on the PCB using a thermal compression method that involves applying a constant heat to the components. It is important that the solder-coated lead of the TAB IC should be aligned properly with the solder-coated pad on the PCB to further increasing quality of soldering between the solder-coated lead and the solder-coated pad.

According to the present invention described above, the quality of soldering between the solder-coated lead of the TAB IC and the solder-coated pad on the PCB is increased when connecting the solder-coated lead of the TAB IC with solder-coated pad on the PCB. This has the effect of increasing the yield of LCD production and reducing production costs.

The present invention is not limited to the above-described embodiments. Various changes and modifications may be effected by one having an ordinary skill in the art and remain within the scope of the invention, as defined by the appended claims.

What is claimed is:

1. A liquid crystal display comprising:
   a solder-coated pad on a printed circuit board; and
   a solder-coated lead of a tab automated bonding integrated circuit, having a different shape from that of the solder-coated pad, the solder-coated lead being electrically connected with the solder-coated pad, wherein the solder-coated lead has a rectangular surface and the solder-coated pad has a trapezoid surface.

2. A liquid crystal display as recited in claim 1, wherein a first horizontal side length of the solder-coated pad is about twice a horizontal side length of the solder-coated lead.

3. A liquid crystal display as recited in claim 1, wherein a second horizontal side length of the solder-coated pad is about equal to the horizontal side length of the solder-coated lead.

4. A liquid crystal display comprising:

a solder-coated pad on a printed circuit board; and a solder-coated lead of a tab automated bonding integrated circuit, having a different shape from that of the solder-coated pad, the solder-coated lead being electrically connected with the solder-coated pad, wherein the solder-coated pad has a rectangular surface and the solder-coated lead has a trapezoid surface.

5. A liquid crystal display as recited in claim 4, wherein a first horizontal side length of the solder-coated lead is about half of a horizontal side length of the solder-coated pad.

6. A liquid crystal display as recited in claim 4, wherein a second horizontal side length of the solder-coated lead is about equal to the horizontal side length of the solder-coated pad.

7. A liquid crystal display comprising:

a solder-coated pad on a printed circuit board; and a solder-coated lead of a tab automated bonding integrated circuit, having a different shape from that of the solder-coated pad, the solder-coated lead being electrically connected with the solder-coated pad, wherein the solder-coated lead has a rectangular surface and the solder-coated pad has a hexagonal surface.

8. A liquid crystal display as recited in claim 7, wherein an inner horizontal side length of the solder-coated pad is about twice a horizontal side length of the solder-coated lead.

9. A liquid crystal display as recited in claim 7, wherein an outer horizontal side length of the solder-coated pad is about equal to the horizontal side length of the solder-coated lead.

10. A liquid crystal display as recited in claim 7, wherein an inner horizontal side length of the solder-coated pad is about half a horizontal side length of the solder-coated lead.

11. A liquid crystal display comprising:

a solder-coated pad on a printed circuit board; and a solder-coated lead of a tab automated bonding integrated circuit, having a different shape from that of the solder-coated pad, the solder-coated lead being electrically connected with the solder-coated pad, wherein the solder-coated pad has a rectangular surface and the solder-coated lead has a hexagonal surface.

12. A liquid crystal display as recited in claim 11, wherein an inner horizontal side length of the solder-coated lead is about twice a horizontal side length of the solder-coated pad.

13. A liquid crystal display as recited in claim 11, wherein an outer horizontal side length of the solder-coated lead is about equal to the horizontal side length of the solder-coated pad.

14. A liquid crystal display as recited in claim 11, wherein an inner horizontal side length of the solder-coated lead is about half a horizontal side length of the solder-coated pad.

15. A liquid crystal display comprising:

a solder-coated pad on a printed circuit board; and a solder-coated lead of a tab automated bonding integrated circuit, having a different shape from that of the solder-coated pad, the solder-coated lead being electrically connected with the solder-coated pad, wherein the solder-coated lead has a rectangular surface and the solder-coated pad has a bow tie-like surface.

16. A liquid crystal display as recited in claim 15, wherein an outer horizontal side length of the solder-coated pad is about twice a horizontal side length of the solder-coated lead.

17. A liquid crystal display as recited in claim 15, wherein an outer horizontal side length of the solder-coated pad is about half a horizontal side length of the solder-coated lead.

18. A liquid crystal display as recited in claim 15, wherein an inner horizontal side length of the solder-coated pad is about equal to a horizontal side length of the solder-coated lead.

* * * * *